United States Patent
Lu et al.

(10) Patent No.: US 10,056,288 B1
(45) Date of Patent: Aug. 21, 2018

(54) SEMICONDUCTOR DEVICE AND FABRICATION METHOD THEREOF

(71) Applicants: UNITED MICROELECTRONICS CORP., Hsin-Chu (TW); Fujian Jinhua Integrated Circuit Co., Ltd., Quanzhou, Fujian province (CN)

(72) Inventors: Tsuo-Wen Lu, Kaohsiung (TW); Chin-Wei Wu, Hsinchu (TW); Tien-Chen Chan, Tainan (TW); Ger-Pin Lin, Tainan (TW); Shu-Yen Chan, Changhua County (TW)

(73) Assignees: UNITED MICROELECTRONICS CORP., Hsin-Chu (TW); Fujian Jinhua Integrated Circuit Co., Ltd., Quanzhou, Fujian province (CN)

( * ) Notice: Subject to any disclaimer, the term of this patent is extended or adjusted under 35 U.S.C. 154(b) by 0 days.

(21) Appl. No.: 15/672,272

(22) Filed: Aug. 8, 2017

(30) Foreign Application Priority Data

Jul. 28, 2017 (CN) .......................... 2017 1 0628502

(51) Int. Cl.
| | | |
|---|---|---|
| *H01L 21/762* | (2006.01) | |
| *H01L 21/8234* | (2006.01) | |
| *H01L 27/108* | (2006.01) | |
| *H01L 29/423* | (2006.01) | |
| *H01L 21/764* | (2006.01) | |
| *H01L 21/02* | (2006.01) | |

(52) U.S. Cl.
CPC ...... *H01L 21/76237* (2013.01); *H01L 21/764* (2013.01); *H01L 21/823481* (2013.01); *H01L 27/10823* (2013.01); *H01L 27/10876* (2013.01); *H01L 29/4236* (2013.01); *H01L 21/02164* (2013.01)

(58) Field of Classification Search
CPC .......... H01L 27/10876; H01L 29/4236; H01L 29/66348; H01L 29/66613; H01L 29/66704; H01L 29/66734; H01L 29/7397; H01L 29/7813; H01L 29/7825; H01L 21/823462; H01L 21/823857; H01L 27/10823
See application file for complete search history.

(56) References Cited

U.S. PATENT DOCUMENTS

| | | | |
|---|---|---|---|
| 6,368,920 B1 * | 4/2002 | Beasom | ............ H01L 21/28185 |
| | | | 257/E29.133 |
| 8,772,105 B2 | 7/2014 | Jang | |

(Continued)

FOREIGN PATENT DOCUMENTS

CN 103972071 8/2014

*Primary Examiner* — Bryan Junge
(74) *Attorney, Agent, or Firm* — Winston Hsu

(57) ABSTRACT

A semiconductor device includes a semiconductor substrate having a gate trench penetrating through an active area and a trench isolation region surrounding the active area. The gate trench exposes a sidewall of the active area and a sidewall of the trench isolation region. The sidewall of the trench isolation region includes a void. A first gate dielectric layer conformally covers the sidewall of the active area and the sidewall of the trench isolation region. The void in the sidewall of the trench isolation region is filled with the first gate dielectric layer. A second gate dielectric layer is grown on the sidewall of the active area. A gate is embedded in the gate trench.

7 Claims, 3 Drawing Sheets

(56) References Cited

U.S. PATENT DOCUMENTS

| | | | | |
|---|---|---|---|---|
| 8,835,280 B1* | 9/2014 | Ryu | ................ | H01L 21/28008 |
| | | | | 257/288 |
| 9,064,692 B2 | 6/2015 | Srivastava | | |
| 2005/0110102 A1* | 5/2005 | Wang | ................ | H01L 21/28282 |
| | | | | 257/411 |
| 2005/0282352 A1* | 12/2005 | Cho | ................ | H01L 21/76229 |
| | | | | 438/424 |
| 2009/0200603 A1* | 8/2009 | Ogura | ................ | H01L 21/28282 |
| | | | | 257/326 |
| 2013/0168758 A1* | 7/2013 | Jung | ................ | H01L 27/0207 |
| | | | | 438/424 |
| 2014/0087533 A1* | 3/2014 | Choi | ................ | H01L 29/66477 |
| | | | | 438/253 |

* cited by examiner

SEMICONDUCTOR DEVICE AND FABRICATION METHOD THEREOF

CROSS REFERENCE TO RELATED APPLICATION

This application claims the priority from CN application No. 201710628502.2, filed Jul. 28, 2017, which is included in its entirety herein by reference.

BACKGROUND OF THE INVENTION

1. Field of the Invention

The present invention relates to the field of semiconductor technology, and more particularly to a semiconductor device and a fabrication method thereof.

2. Description of the Prior Art

As the size of the electronic components such as dynamic random access memory devices is getting smaller and smaller, the width of trench isolation region, which is utilized to electrically isolate the semiconductor elements from one another, shrinks significantly. During the fabrication of the trench isolation region, defects such as voids or seams may be formed in the trench isolation region. After filling the gate material into the gate trench, titanium nitride excursion occurs along the voids or seams between two elongated active areas, resulting in the problem of wordline to wordline crosstalk (WL-WL crosstalk).

The present invention proposes an improved semiconductor device and a method of manufacturing the same, which can solve the above-mentioned problems and shortcomings of the prior art.

SUMMARY OF THE INVENTION

It is one object of the present invention to provide an improved semiconductor device which can improve the quality of the gate dielectric layer and improve the drawbacks of the prior art.

According to one aspect of the invention, a semiconductor device is disclosed. The semiconductor device includes a semiconductor substrate having a gate trench extending through an active area and a trench isolation region surrounding the active area. The gate trench exposes a sidewall of the active area and a sidewall of the trench isolation region. The sidewall of the trench isolation region comprises a void. A first gate dielectric layer conformally covers the sidewall of the active area and the sidewall of the trench isolation region. The void in the sidewall of the trench isolation region is filled with the first gate dielectric layer. A second gate dielectric layer is grown on the sidewall of the active area. A gate is then embedded in the gate trench.

According to one aspect of the invention, a method for fabricating a semiconductor device is disclosed. A semiconductor substrate having thereon an active area and a trench isolation region surrounding the active area is provided. A gate trench is formed in the semiconductor substrate. The gate trench extends through the active area and the trench isolation region. The gate trench exposes a sidewall of the active area and a sidewall of the trench isolation region. The sidewall of the trench isolation region comprises a void. A first gate dielectric layer is deposited on interior surface of the gate trench. The first gate dielectric layer conformally covers the sidewall of the active area and the sidewall of the trench isolation region. The void in the sidewall of the trench isolation region is filled with the first gate dielectric layer. An in-situ steam generation (ISSG) process is then performed to thermally grow a second gate dielectric layer on the sidewall of the active area.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1 to 6 are schematic diagrams showing a method of manufacturing a semiconductor device 1 according to one embodiment of the present invention, wherein:

FIG. 1 is a schematic top view showing a partial layout of the semiconductor device 1 according to one embodiment of the present invention;

FIG. 2 is a schematic, cross-sectional view taken along line I-I' in FIG. 1;

FIG. 3 is a perspective view showing exemplary voids in the trench isolation region along a gate trench; and FIG. 4 to FIG. 6 are schematic, cross-sectional views taken along line I-I' at different stages of manufacture.

DETAILED DESCRIPTION

Figure 1:
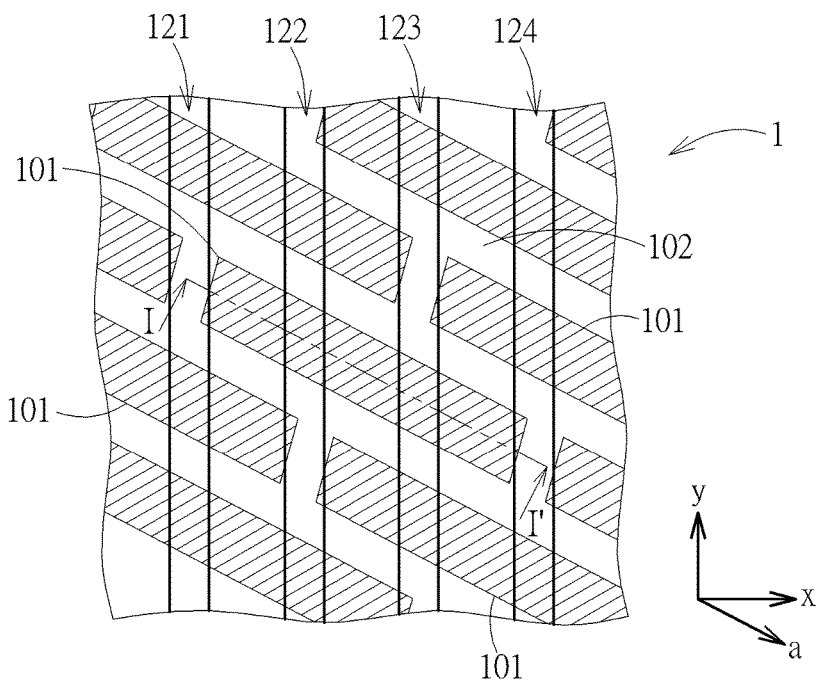

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled. One or more implementations of the present invention will now be described with reference to the attached drawings, wherein like reference numerals are used to refer to like elements throughout, and wherein the illustrated structures are not necessarily drawn to scale.

The present invention pertains to a semiconductor integrated circuit structure, for example, a dynamic random access memory structure in which a gate dielectric layer structure formed in a gate trench comprises an atomic layer deposition (ALD) oxide layer and an in-situ vapor generation (ISSG) oxide layer, which can improve the quality of the gate dielectric layer and improve the shortcomings of the prior art such as the TiN excursion occurs in the voids of the trench isolation region and the WL-WL crosstalk problem.

Figure 2:
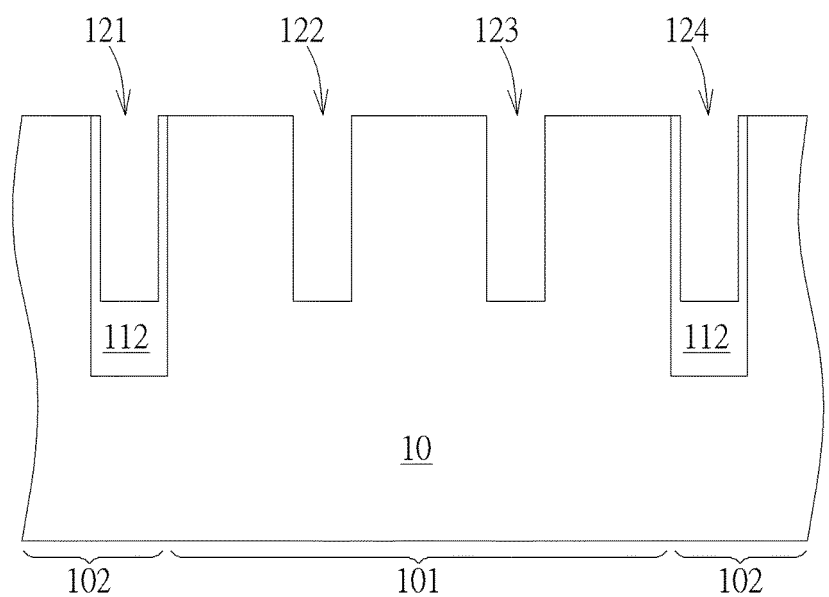
Figure 3:
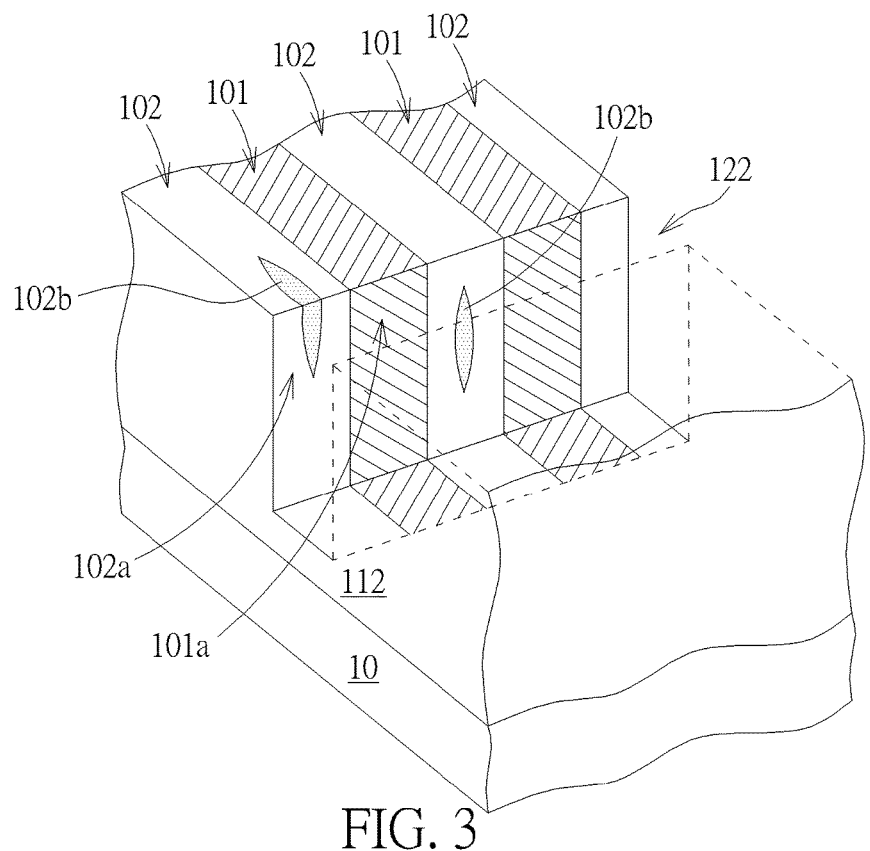
Figure 4:
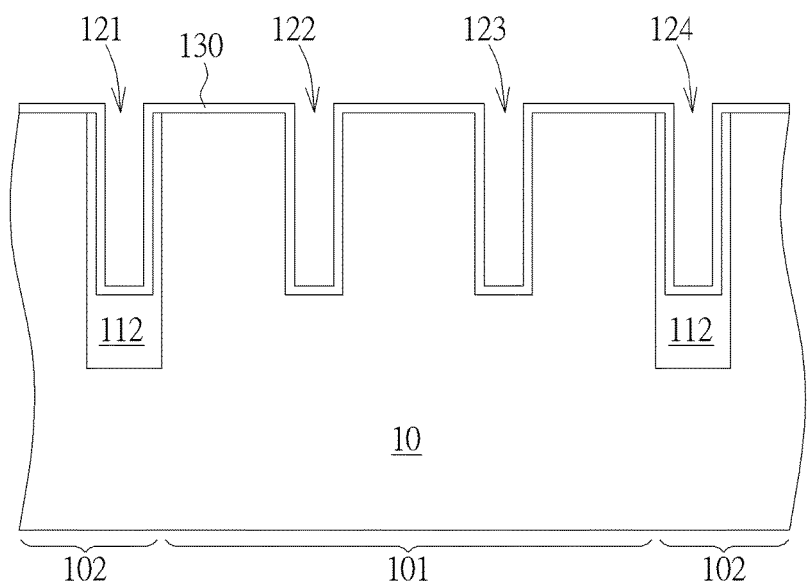
Figure 5:
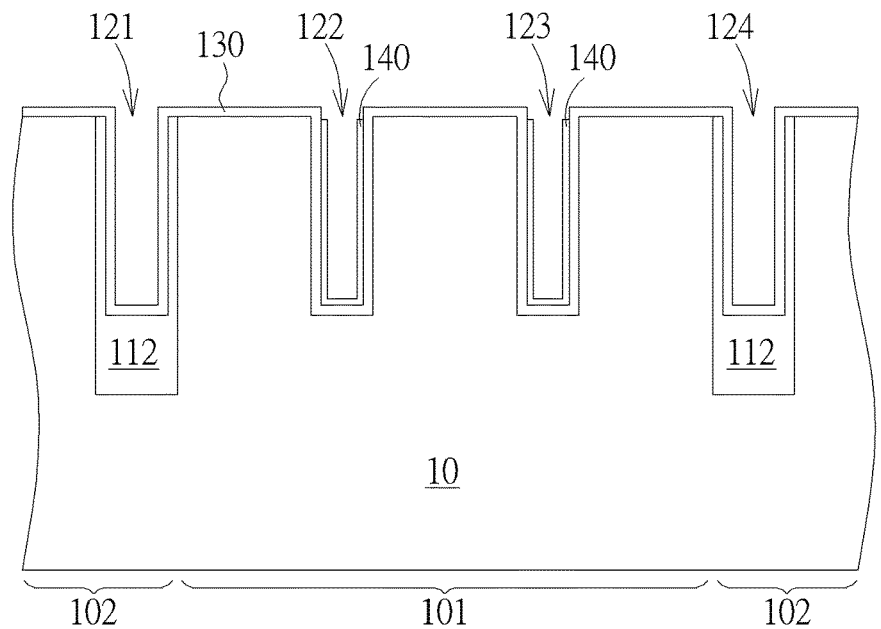
Figure 6:
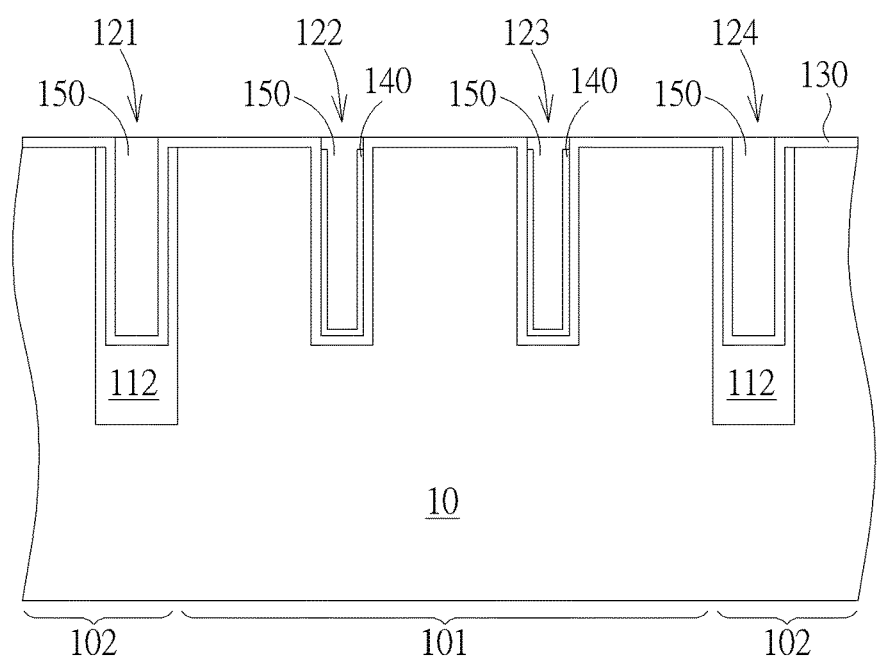

FIGS. 1 to 6 are schematic diagrams showing a method of manufacturing a semiconductor device 1 according to one embodiment of the present invention. FIG. 1 is a schematic top view showing a partial layout of the semiconductor device 1 according to one embodiment of the present invention. FIG. 2 is a schematic, cross-sectional view taken along line I-I' in FIG. 1. FIG. 3 is a perspective view showing exemplary voids in the trench isolation region along a gate trench. FIG. 4 to FIG. 6 are schematic, cross-sectional views taken along line I-I' at different stages of manufacture.

First, as shown in FIGS. 1 to 3, there is provided a semiconductor substrate 10 having an active area 101 and a trench isolation region 102 surrounding the active area 101. The layout structure shown in FIG. 1 may be a memory array region, but is not limited thereto. Each active area 101 has a longer axis extending along a reference a-axis direction. According to one embodiment of the present invention, recessed gate transistor access devices will be formed in each active area 101.

According to one embodiment of the present invention, the semiconductor substrate 10 may be a silicon substrate in which the trench isolation region 102 includes an insulating layer 112, for example, a silicon dioxide layer.

After the formation of the trench isolation region 102 and the active area 101, gate trenches 121~124 are formed in the semiconductor substrate 10, passing through the active area 101 and the trench isolation region 102, wherein the gate trenches 121~124 extend along the reference y-axis direction.

As shown in FIG. 3, taking the gate trenches 122 as an example, the gate trenches 122 expose a sidewall 101a of the active area 101 and a sidewall 102a of the trench isolation region 102, wherein the trench isolation region 102 comprises a void 102b.

As described above, the void 102b in the trench isolation region 102 may be filled with conductive material such as titanium nitride when subsequently the gate is formed in each of the gate trenches 121~124, so as to form a titanium nitride protrusion (TiN excursion), resulting in WL-WL crosstalk problem. The present invention addresses this issue. The present invention provides an improved semiconductor device and a method of manufacturing the same in view of the above-mentioned problems and disadvantages of the prior art.

As shown in FIG. 4, after the formation of the gate trenches 121~124, a first gate dielectric layer 130 is deposited on the interior surfaces of the gate trenches 121~124 and the top surface of the semiconductor substrate 10 in a blanket manner. The first gate dielectric layer 130 conformally covers the sidewalls 101a of the active area 101 and sidewalls 102a of the trench isolation region 102, and the void 102b is filled up with the first gate dielectric layer 130.

According to one embodiment of the present invention, the first gate dielectric layer 130 comprises an atomic layer deposition (ALD) oxide layer deposited by an atomic layer deposition (ALD) method, such as a silicon dioxide layer. According to one embodiment of the present invention, the thickness of the first gate dielectric layer 130 ranges between 40 and 60 angstroms, for example 50 angstroms.

Next, as shown in FIG. 5, a in-situ steam generation (ISSG) process is performed, and a second gate dielectric layer 140 is thermally grown on the sidewall 101a of the active area 101 in the gate trenches 121~124. The second gate dielectric layer 140 is an in-situ vapor generation (ISSG) oxide layer.

According to one embodiment of the present invention, the in-situ steam generation process is carried out at a temperature of about 1000° C. and in an atmosphere containing hydrogen, oxygen and nitrogen. According to one embodiment of the present invention, the percentage of the hydrogen gas is 25% to 40% by volume, which is commonly referred to as high steam conditions, for example, under the volume percentage of hydrogen of 33%.

According to one embodiment of the present invention, the flow rate of the hydrogen gas ranges between 1 and 10 standard liters per minute (slm), the flow rate of said nitrogen is less than 10 slm, and the flow rate of oxygen ranges between 2 and 10 slm A high-quality silicon dioxide gate dielectric layer can be formed by performing the ISSG process under the high steam conditions with a volume percentage of hydrogen gas of 33%. In addition, by introducing nitrogen gas (flow rate less than 10 slm) during the ISSG process, the soak time is extended, for example, between 14 and 36 seconds, thereby improving the leakage property of the gate dielectric layer.

Finally, as shown in FIG. 6, a second gate dielectric layer 140 is thermally grown on the sidewall 101a of the active area 101. Subsequently, a gate 150 is formed in each of the gate trenches 121~124. According to one embodiment of the present invention, the gate 150 may comprise a titanium nitride layer and a tungsten metal layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
    providing a semiconductor substrate having thereon an active area and a trench isolation region surrounding the active area;
    forming a gate trench in the semiconductor substrate, wherein the gate trench extends through the active area and the trench isolation region, wherein the gate trench exposes a sidewall of the active area and a sidewall of the trench isolation region, wherein the sidewall of the trench isolation region comprises a void;
    depositing a first gate dielectric layer on interior surface of the gate trench, wherein the first gate dielectric layer conformally covers the sidewall of the active area and the sidewall of the trench isolation region, wherein the void in the sidewall of the trench isolation region is filled with the first gate dielectric layer, wherein the first gate dielectric layer is a silicon oxide film; and
    performing an in-situ steam generation (ISSG) process to thermally grow a second gate dielectric layer on the sidewall of the active area, wherein the second gate dielectric layer is in direct contact with the first gate dielectric layer.

2. The method for fabricating a semiconductor device according to claim 1 further comprising:
    after thermally growing the second gate dielectric layer on the sidewall of the active area, forming a gate in the gate trench.

3. The method for fabricating a semiconductor device according to claim 1, wherein the ISSG process is performed at a temperature of about 1000° C. and atmosphere of hydrogen, oxygen, and nitrogen.

4. The method for fabricating a semiconductor device according to claim 3, wherein a percentage of hydrogen ranges between 25% and 40% by volume during the ISSG process.

5. The method for fabricating a semiconductor device according to claim 3, wherein a flow rate of hydrogen ranges between 1 and 10 standard liter per minute (slm) during the ISSG process.

6. The method for fabricating a semiconductor device according to claim 3, wherein a flow rate of nitrogen is less than 10 slm during the ISSG process.

7. The method for fabricating a semiconductor device according to claim 3, wherein a flow rate of oxygen ranges between 2 and 10 slm during the ISSG process.

\* \* \* \* \*